(12) United States Patent
Zhang et al.

(10) Patent No.: US 8,982,916 B2
(45) Date of Patent: Mar. 17, 2015

(54) METHOD FOR PRODUCING AN EXTERNALLY INJECTED GAIN SWITCH LASER ULTRASHORT PULSE

(75) Inventors: Jianguo Zhang, Xi'an (CN); Wei Zhao, Xi'an (CN); Yuanshan Liu, Xi'an (CN)

(73) Assignee: Xi'an Institute of Optics and Precision Mechanics of Chinese Academy of Sciences, Xi'an (CN)

( * ) Notice: Subject to any disclaimer, the term of this patent is extended or adjusted under 35 U.S.C. 154(b) by 932 days.

(21) Appl. No.: 12/593,431

(22) PCT Filed: Aug. 8, 2007

(86) PCT No.: PCT/CN2007/002380
§ 371 (c)(1),
(2), (4) Date: Mar. 17, 2010

(87) PCT Pub. No.: WO2008/116357
PCT Pub. Date: Oct. 2, 2008

(65) Prior Publication Data
US 2010/0189141 A1 Jul. 29, 2010

(30) Foreign Application Priority Data
Mar. 28, 2007 (CN) .......................... 2007 1 0017577

(51) Int. Cl.
| | |
|---|---|
| H01S 3/098 | (2006.01) |
| H01S 5/00 | (2006.01) |
| H01S 5/065 | (2006.01) |
| H01S 5/042 | (2006.01) |
| H01S 5/40 | (2006.01) |

(52) U.S. Cl.
CPC .............. *H01S 5/065* (2013.01); *H01S 5/0078* (2013.01); *H01S 5/0427* (2013.01); *H01S 5/0656* (2013.01); *H01S 5/0657* (2013.01); *H01S 5/4006* (2013.01)
USPC ......................................... 372/19; 372/43.01

(58) Field of Classification Search
None
See application file for complete search history.

(56) References Cited

U.S. PATENT DOCUMENTS

| 5,541,947 A | * | 7/1996 | Mourou et al. | 372/25 |
|---|---|---|---|---|
| 5,960,013 A | * | 9/1999 | Sheffield | 372/37 |
| 5,974,060 A | * | 10/1999 | Byren et al. | 372/19 |
| 7,515,626 B2 | | 4/2009 | Lee et al. | |
| 2001/0004290 A1 | | 6/2001 | Lee et al. | |
| 2004/0184491 A1 | | 9/2004 | Wai et al. | |

FOREIGN PATENT DOCUMENTS

| CN | 1738221 A | 2/2006 |
|---|---|---|
| CN | 1855791 A | 11/2006 |

OTHER PUBLICATIONS

Fang, Xiaohui et al., Tunable Dual-Wavelength Optical Short Pulse Generation in a Mutual Pulse Injection-Seeding Scheme, *Acta Optica Sinica*, vol. 25, No. 1, pp. 67-71, Jan. 2005.
Wang, Yuncai, "Experimental study on the timing jitter of gain-switched laser diodes with photon injection," *ACTA Physica Sinica*, vol. 52, No. 9, pp. 2190-2193, Sep. 2003.

* cited by examiner

*Primary Examiner* — Julio J Maldonado
*Assistant Examiner* — Sean Hagan
(74) *Attorney, Agent, or Firm* — Gifford, Krass, Sprinkle, Anderson & Citkowski, P.C.

(57) ABSTRACT

A method for producing an externally injected gain switch laser ultrashort pulse, comprising the following steps of ultrashort light pulse signals having multi-longitudinal mode characteristic produced by the gain switch laser are inputted into an optical amplifier and then amplified; a spectral component signal selector selects a narrow spectral component signal outputted by the optical amplifier, the narrow spectral component signal is within an amplified spontaneous emission noise frequency band and its central wavelength is equal to the longitudinal mode of the gain switch laser; a route of the narrow spectral component signal is used as an external seed light and reinjected into the gain switch laser via a spectral component signal feedback loop. Therefore, the oscillation of a selected single longitudinal mode within the cavity of the gain switch laser is enhanced, thereby forming an externally light injected locking.

13 Claims, 3 Drawing Sheets

METHOD FOR PRODUCING AN EXTERNALLY INJECTED GAIN SWITCH LASER ULTRASHORT PULSE

FIELD OF THE INVENTION

The present invention relates to a method for producing a laser signal from a gain-switched laser, and in particular, to a method for producing ultrashort pulses from an external injection gain-switched laser.

BACKGROUND OF THE INVENTION

An ultrashort optical pulse source is among the key components for realizing ultrahigh speed, large capacity all-optical communication systems and networks, and is of great application value in ultrawide band optical signal sampling, optical storing, ultrahigh speed photon analog-to-digital conversion, and so on. In practice, it is generally required that an ultrashort optical pulse source have characteristics such as small volume, simple structure, high repetition frequency, low jitter, good universality, low cost and high reliability. In telecommunication applications, in order to obtain ultrahigh speed optical transmitters and arrays thereof that are compact in structure and capable of being manufactured in batches, it is also required that an ultrashort optical pulse source be characteristic of being capable of being integrated with other optical devices.

The gain-switched operation of a semiconductor laser is a simple, reliable technique for producing ultrashort optical pulses, which can be conveniently applied to existing commercial semiconductor lasers, and this kind of lasers can output with flexibility an optical pulse signal of the order of picosecond with variable repetition frequency, to adapt to rates for various communication interfaces or upgrading of networks, and to perform ultrafast sampling, waveform monitoring and the like on signals of different data rates. However, a gain-switched laser suffers from the problems of having large timing jitter and frequency chirp. Such problems can be solved by means of light injection locking and optical filtering.

Light injection locking of a gain-switched laser can be categorized as two methods, external light injection and self-seed injection. Although using external light injection technique and self-seed injection technique can achieve wavelength tenability of an optical pulse signal in a gain-switched operating state and the effect of suppressing timing jitter, both of the two techniques have defects. The self-seed injection technique requires that the relationship as defined by the following formula (1) be strictly satisfied between the length L of the outer cavity loop of a gain-switched laser and the repetition frequency $f_r$ of an ultrashort optical pulse periodic sequence produced thereby:

$$f_r = \frac{m}{\tau} \quad (1)$$

where m is a positive integer, τ represents the transmission time required for an ultrashort optical pulse signal to pass through the outer cavity loop and is related to the length L. If the transmission speed of the optical pulse signal in the outer cavity loop is v, then there stands $$\tau = \frac{L}{v}.$$

Once the outer cavity loop is designed, the length L of the outer cavity loop will be fixed, and the repetition frequency $f_r$ of the ultrashort optical pulse periodic sequence produced by the self-injection gain-switched laser can be determined by the formula (1), and thus the gain-switched mode will lose the characteristic of being capable of changing the repetition frequency $f_r$ of an optical pulse signal with flexibility. In practical applications, due to the influence of change in the ambient temperature and the like, in engineering projects it is difficult to ensure that the repetition frequency $f_r$ as determined according to the formula (1) is always applicable for data rates for interfaces of communication systems and networks, which greatly limits the application range of the self-injection gain-switched laser. Although this problem can be solved by using the external injection technique, when the external injection technique is used the gain-switched laser generally requires a narrow spectral width wavelength-tunable continuous wave (CW) light source to be additionally used as an externally-injected seed light source, which results in increased cost, complex structure and increased volume of the gain-switched laser.

BRIEF DESCRIPTION OF THE INVENTION

An object of the present invention is to provide a method for producing ultrashort pulses from an external injection gain-switched laser to solve the technical problems of the above prior art gain-switched lasers, of having fixed repetition frequency, restricted application range, complex structure, large volume and high cost.

The technical solution of the present invention is as follows:

A method for producing ultrashort pulses from an external injection gain-switched laser, the method comprising the following steps:

(i) inputting an ultrashort optical pulse sequence signal with multi-longitudinal mode spectral characteristic, produced by a gain-switched laser, into an optical amplifier to amplify it;

(ii) selecting, by a spectral component signal selector, a narrow spectral component signal outputted by the optical amplifier that is within an amplified spontaneous emission (ASE) noise frequency band and has a central wavelength equal to one of the longitudinal modes of the gain-switched laser; and (iii) using one part of the narrow spectral component signal outputted by the spectral component signal selector as an external seed light, the seed light being reinjected into the gain-switched laser via a spectral component signal feedback loop so that the oscillation of a selected single longitudinal mode within a cavity of the gain-switched laser is enhanced, thereby forming external light injection locking, another part of the narrow spectral component signal outputted by the spectral component signal selector being used as a required ultrashort pulse.

When the output wavelength of the spectral component signal selector is changed to correspond to a certain different longitudinal mode of the gain-switched laser, a central wavelength, at which the selected single longitudinal mode within the cavity of the gain-switched laser operates, is also changed, whereby tunable wavelength of the gain-switched laser is enabled.

The gain-switched laser can be realized using an F-P semiconductor laser, i.e. Fabry-Perot semiconductor laser.

The optical amplifier can be a semiconductor optical amplifier or Erbium-doped fiber amplifier, which covers a required band and is of wide spectra.

The spectral component signal selector determines the spectral width of the output thereof according to the interval between the longitudinal modes outputted by the F-P semiconductor laser, and the spectral component signal selector can be a narrow band filter or tunable fiber grating.

The present invention has the following advantages.
1. It has simple structure, is easy to manufacture and can be optically integrated.
2. It can be understood that, by changing the repetition frequency of a radio frequency signal driving the gain-switched laser, the repetition frequency of the ultrashort optical pulse signal produced by the gain-switched laser is changed, and additionally, by changing the output wavelength of the spectral component signal selector, the central wavelength of the selected longitudinal mode can be changed; therefore, the present invention has the characteristic of being capable of changing the repetition frequency of the optical pulse with flexibility, and also has the function of enabling tunable wavelength.
3. There is no need for a narrow spectral continuous laser with tunable wavelength to be used as a special externally-injected seed light source, not only simplifying the structure of the system but also lowering the cost and reducing the volume thereof.
4. Timing jitter and frequency chirp is small and the stability is good.

The above and other advantages of the present invention will become apparent through detailed description given below.

DETAILED DESCRIPTION OF THE INVENTION

Figure 1:
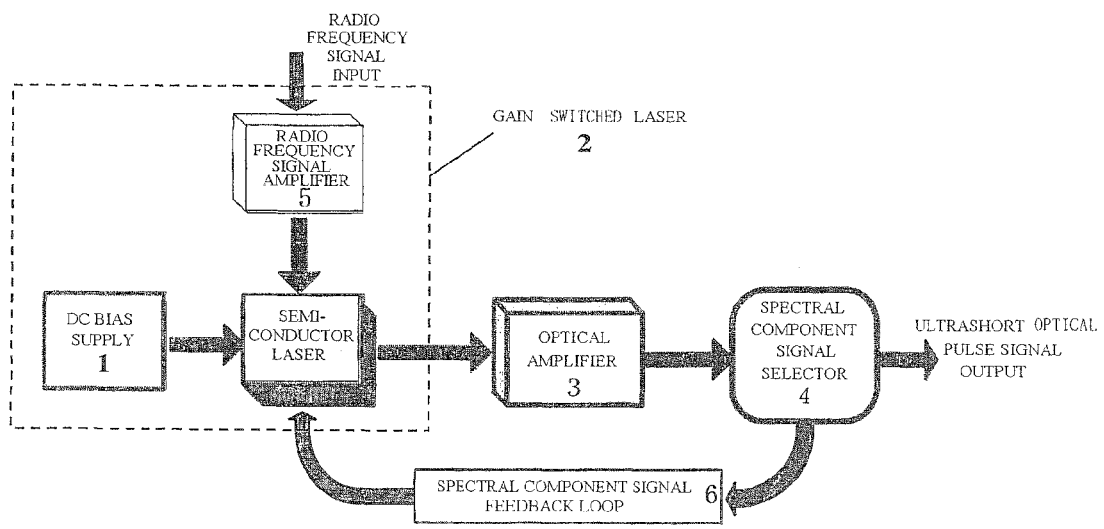
FIG. 1 is a schematic diagram illustrating the present invention.

Referring to FIG. 1, the present invention is realized by an apparatus mainly consisting of a gain-switched laser 2, an optical amplifier 3, a spectral component signal selector 4 and a spectral component signal feedback loop 6. The external light injection of the gain-switched laser 2 is achieved by means of an optical feedback loop. Since optical pulse signals outputted by the gain-switched laser typically have relatively low power, in practical applications an optical amplifier is usually required to enhance the power thereof. The steps for carrying out the present invention are as below.

(i) An ultrashort optical pulse sequence signal having multi-longitudinal mode spectral characteristic, produced by the gain-switched laser 2, is inputted into the optical amplifier 3 to be amplified. The gain-switched laser 2 can be realized using an F-P semiconductor laser, and in particular, can be a conventional gain-switched laser comprised of an F-P semiconductor laser, a radio frequency signal amplifier 5 and a DC bias supply 1. The optical amplifier 3 can be an amplifier, such as semiconductor optical amplifier, Erbium-doped fiber amplifier, or the like, which covers a required band and is of wide spectra. It can be readily understood that, the required band depends on and should match the operating band of the gain-switched laser. In addition, it should be pointed out that the optical amplifier on the one hand serves to amplify the inputted signal, and on the other hand, while amplifying the inputted signal, it also introduces spontaneous emission noise having wide spectra into the inputted optical signal.

(ii) A narrow spectral component signal outputted by the optical amplifier 3 that is within the amplified spontaneous emission noise frequency band and has a central wavelength equal to one of the longitudinal modes of the gain-switched laser 2 is selected by the spectral component signal selector 4. According to the preceding description, it can be seen that the ultrashort optical pulse signal produced by the gain-switched laser 2, after being amplified by the optical amplifier 3, are inputted to the spectral component signal selector 4 along with the amplified spontaneous emission noise having wide spectra that is inherent in the optical amplifier 3. Since the optical amplifier 3 generates amplified spontaneous emission noise having wide spectra, by the spectral component signal selector 4 provided at the output of the optical amplifier 3, the narrow spectral component signal within the spontaneous emission noise frequency band can be selected. The spectral component signal selector 4 can determine the spectral width of the output thereof according to the interval of the longitudinal modes outputted by the F-P semiconductor laser, and can be selected as a narrow band filter, and can also be selected as other spectral component signal selectors, like a tunable fiber grating.

(iii) One part of the narrow spectral component signal outputted by the spectral component signal selector 4 is taken as an external seed light, and the seed light is reinjected into the gain-switched laser 2 via the spectral component signal feedback loop 6 so that the oscillation of a selected single longitudinal mode within a cavity of the gain-switched laser 2 is enhanced, forming external light injection locking; another part of the signal outputted by the spectral component signal selector 4 is used as a required ultrashort pulse. In order to lock the externally injected optical signal, the narrow spectral component signal selected by the spectral component signal selector 4 can be made have a central wavelength equal to one of the multiple longitudinal modes of the gain-switched laser 2, and thus the optical signal outputted by the spectral component signal selector 4 can be used as external seed light to be reinjected into the gain-switched laser 2, so that the oscillation of the selected longitudinal mode within the cavity of the gain-switched laser 2 is obviously enhanced, while other longitudinal modes within the cavity of the gain-switched laser 2 are suppressed. Thus, single longitudinal mode operation of the gain-switched laser 2 is ensured, and timing jitter is effectively suppressed. Since the spontaneous emission of the optical amplifier 3 has very wide gain spectra, when the spectral component signal selector 4 selects a narrow spectral component signal corresponding to a certain longitudinal mode of the gain-switched laser 2 and injects this signal to the gain-switched laser 2 via the spectral component signal feedback loop 6, the oscillation of a longitudinal mode within the cavity of the gain-switched laser 2 that corresponds to the wavelength of the injected narrow spectral component signal is enhanced. By changing the output wavelength of the spectral component signal selector 4 and making the output wavelength obtained each time by changing corresponding to a certain different longitudinal mode of the gain-switched laser 2, a central wavelength, at which the selected single longitudinal mode within the cavity of the gain-switched laser 2 operates, can be changed, and tunable wavelength of the gain-switched laser 2 is enabled. One part of the optical signal outputted by the spectral component signal selector 4 is fed into the gain-switched laser 2 via the spectral component signal feedback loop 6 to form external light injection locking, suppressing other multiple longitudinal modes within the cavity of the gain-switched laser 2 that are unwanted and achieving single longitudinal mode operation. Another part of the optical signal outputted by the spectral component signal selector 4 is exactly the required ultrashort optical pulse sequence.

Figure 2:
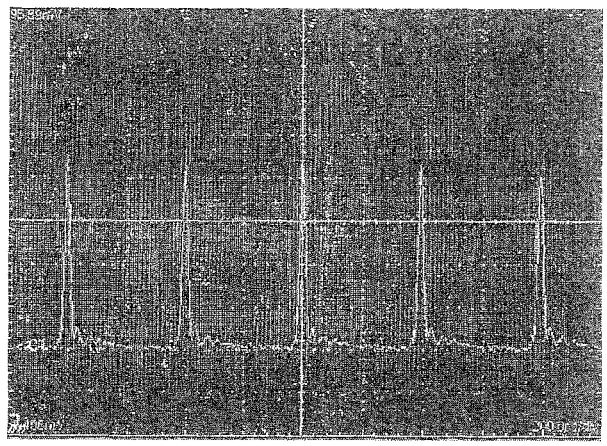
FIG. 2 shows a waveform of a time domain optical pulse signal outputted by a conventional gain-switched semiconductor laser without light injection.
Figure 3:
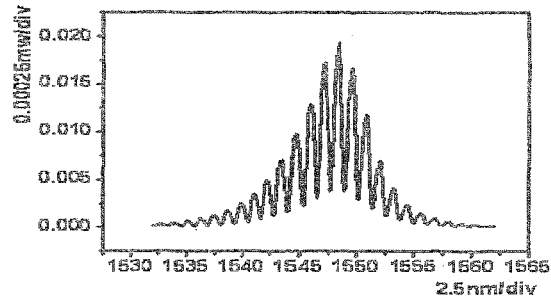
FIG. 3 shows a spectral diagram outputted by a conventional gain-switched semiconductor laser without light injection.
Figure 4:
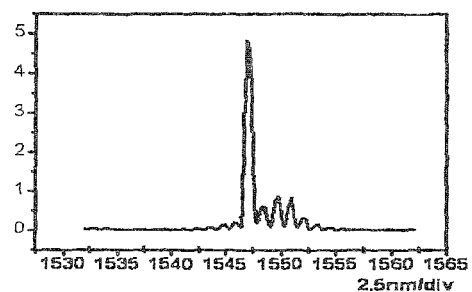
FIG. 4 shows a spectral diagram outputted using the present invention under light injection locking of a wavelength of 1547 nm.
Figure 5:
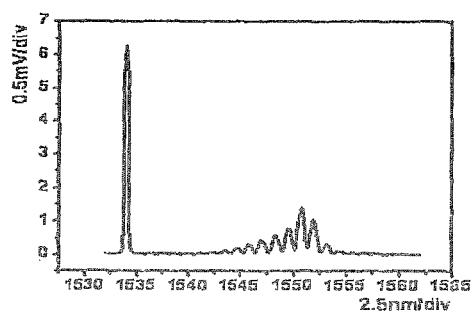
FIG. 5 shows a spectral diagram outputted using the present invention under light injection locking of a wavelength of 1534 nm.
Figure 6:
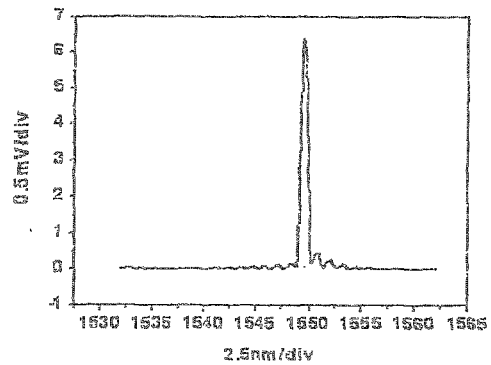
FIG. 6 shows a spectral diagram outputted using the present invention under light injection locking of a wavelength of 1549 nm.
Figure 7:
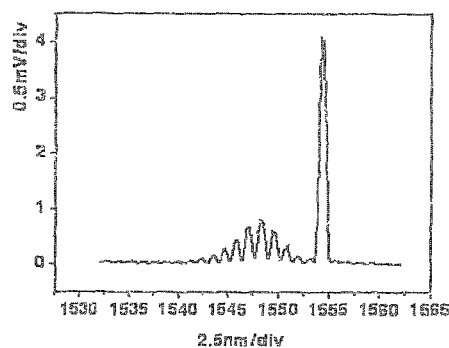
FIG. 7 shows a spectral diagram outputted using the present invention under light injection locking of a wavelength of 1554 nm.

As shown in FIG. 1, the gain-switched laser 2 is a conventional gain-switched laser, which comprises a semiconductor laser, a radio frequency signal amplifier 5 and a DC bias supply 1. If in case of no light being injected, a DC bias supply 1 is applied to the semiconductor laser, such as F-P semiconductor laser, in the gain-switched laser 2, and a radio frequency signal is used to drive it, the gain-switched laser 2 generates an ultrashort optical pulse sequence, as shown in FIG. 2, which shows a waveform in time domain of the so-generated ultrashort optical pulse sequence. This pulse sequence has the defects such as large jitter, multiple-longitudinal mode spectra, and untunable wavelength, and the multiple-longitudinal mode characteristic thereof is shown in FIG. 3. The ultrashort optical pulse sequence has a repetition frequency equal to that of the radio frequency signal.

Figure 8:
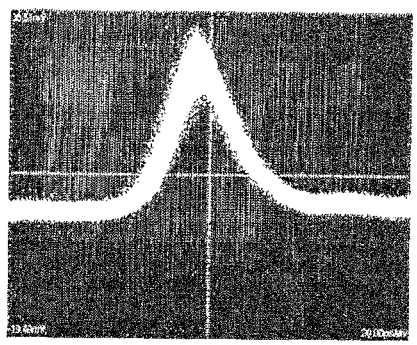
FIG. 8 shows a waveform of an optical pulse signal having jitter of 3 ps outputted by a conventional gain-switched laser without light injection.
Figure 9:
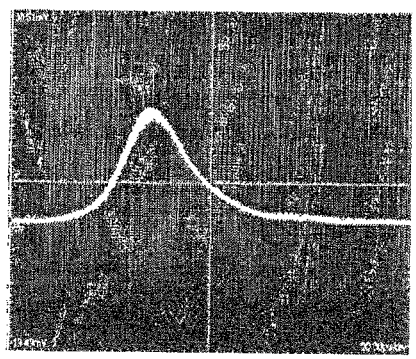
FIG. 9 shows a waveform of an ultrashort optical pulse signal having jitter of 0.5 ps obtained according to the present invention using the external injection technique.

According to the present invention, the spectral component signal selector 4 selects a spectral component signal corresponding to a certain longitudinal mode of the gain-switched laser 2, and via the spectral component signal feedback loop 6, injects this spectral component signal to the F-P semiconductor laser in the gain-switched laser 2, achieving single longitudinal mode operation of the gain-switched laser 2, as shown in FIGS. 4, 5, 6, and 7, which respectively show spectral diagrams outputted using the present invention under light injection locking of a wavelength of 1547nm, 1534nm, 1549nm, and 1554nm Thus it can be seen that, by changing the output wavelength of the spectral component signal selector 4 and making output wavelength values each corresponding to one of the various longitudinal modes of the gain-switched laser 2, tunable wavelength can be achieved, while frequency chirp of the gain-switched optical pulse signal is reduced. In case of no light being injected, the ultrashort optical pulse signal generated by the gain-switched laser 2 has marked timing jitter, as shown in FIG. 8. With the present invention, in which light injection locking is employed, the timing jitter of the ultrashort optical pulse signal generated by the gain-switched laser 2 is greatly reduced, as shown in FIG. 9. The present invention is used to obtain a gain-switched laser that has variable repetition frequency and low jitter, and operates in single longitudinal mode.

Figure 10:
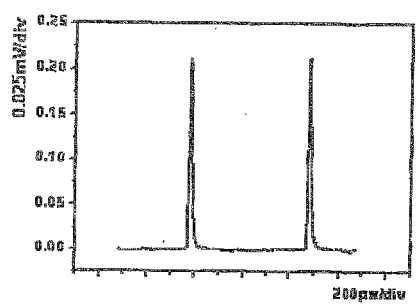
FIG. 10 shows an ultrashort optical pulse sequence with a repetition frequency of 1 GHz obtained using the present invention.
Figure 11:
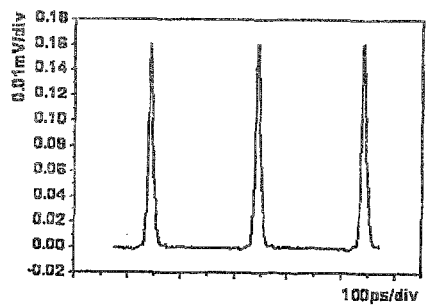
FIG. 11 shows an ultrashort optical pulse sequence with a repetition frequency of 2.5 GHz obtained using the present invention.

FIGS. 10 and 11 show experimentally measured change in repetition frequency of the outputted optical pulse signal obtained using the present invention as change in repetition frequency of the radio frequency sinusoidal or cosinoidal signal at the input terminal, wherein FIG. 10 shows an ultrashort optical pulse sequence with a repetition frequency of 1 GHz obtained using the present invention, and FIG. 11 shows an ultrashort optical pulse sequence with a repetition frequency of 2.5 GHz obtained using the present invention.

We claim:

1. A method for producing ultrashort pulses from an external injection gain-switched laser, comprising the steps of:
    amplifying an ultrashort optical pulse sequence signal having multi-longitudinal mode spectral characteristic produced by a gain-switched laser using an optical amplifier;
    selecting, by a spectral component signal selector, a narrow spectral component signal outputted by the optical amplifier that is within an amplified spontaneous emission noise frequency band and has a central wavelength equal to one of the longitudinal modes of the gain-switched laser;
    using one part of the narrow spectral component signal outputted by the spectral component signal selector as an external seed light, the seed light being reinjected into the gain-switched laser via a spectral component signal feedback loop so that the oscillation of a selected single longitudinal mode within a cavity of the gain-switched laser is enhanced, thereby forming external light injection locking; and
    using another part of the narrow spectral component signal outputted by the spectral component signal selector as a source of an ultrashort pulse.

2. The method for producing ultrashort pulses from an external injection gain-switched laser according to claim 1, including the step of changing the output wavelength of the spectral component signal selector to correspond to a different longitudinal mode of the gain-switched laser, thereby changing the selected single longitudinal mode within the cavity of the gain-switched laser.

3. The method for producing ultrashort pulses from an external injection gain-switched laser according to claim 1, wherein the gain-switched laser is an F-P semiconductor laser.

4. The method for producing ultrashort pulses from an external injection gain-switched laser according to claim 2, wherein the gain-switched laser is an F-P semiconductor laser.

5. The method for producing ultrashort pulses from an external injection gain-switched laser according to claim 3, wherein the optical amplifier is a semiconductor optical amplifier or Erbium-doped fiber amplifier.

6. The method for producing ultrashort pulses from an external injection gain-switched laser according to claim 4, wherein the optical amplifier is a semiconductor optical amplifier or Erbium-doped fiber amplifier.

7. The method for producing ultrashort pulses from an external injection gain-switched laser according to claim 5, wherein the spectral component signal selector determines the spectral width of the output thereof according to the interval between the longitudinal modes outputted by the F-P semiconductor laser, and the spectral component signal selector is a narrow band filter or tunable fiber grating.

8. The method for producing ultrashort pulses from an external injection gain-switched laser according to claim 6, wherein the spectral component signal selector determines the spectral width of the output thereof according to the interval between the longitudinal modes outputted by the F-P semiconductor laser, and the spectral component signal selector is a narrow band filter or tunable fiber grating.

9. A system for producing ultrashort laser pulses, comprising:
   an external injection, gain-switched laser outputting an ultrashort optical pulse sequence signal having a multi-longitudinal mode spectral characteristic;
   a spectral component signal selector configured to receive the output of the gain-switched laser and select a narrow spectral component signal within a spontaneous emission noise frequency band having a central wavelength equal to one of the longitudinal modes of the gain-switched laser; and
   a first output of the spectral component signal selector forming an optical feedback path coupling the output of the spectral component signal selector to the gain-switched laser for use as an external seed light to enhance the oscillation of the selected single longitudinal mode thereby forming external light injection locking; and
   a second output of the spectral component signal selector being used as an ultrashort pulse generator.

10. The system of claim 9, wherein the gain-switched laser is an F-P semiconductor laser.

11. The system of claim 9, further including an optical amplifier situated between the output of the gain-switched laser and the input to the spectral component signal selector.

12. The system of claim 11, wherein the optical amplifier is a semiconductor optical amplifier or Erbium-doped fiber amplifier.

13. The system of claim 9, wherein the spectral component signal selector determines the spectral width of the output thereof according to the interval between the longitudinal modes outputted by the F-P semiconductor laser, and the spectral component signal selector is a narrow band filter or tunable fiber grating.

* * * * *